United States Patent
Yu et al.

[19]

[11] Patent Number: 5,828,612
[45] Date of Patent: Oct. 27, 1998

[54] METHOD AND CIRCUIT FOR CONTROLLING A PRECHARGE CYCLE OF A MEMORY DEVICE

[75] Inventors: Ruey J. Yu; Paul William Hollis; Renny Lee Eisele, all of Austin, Tex.

[73] Assignee: Motorola, Inc., Schaumburg, Ill.

[21] Appl. No.: 958,646

[22] Filed: Oct. 27, 1997

[51] Int. Cl.$^6$ .................................................. G11C 7/00
[52] U.S. Cl. .......................................... 365/203; 365/233
[58] Field of Search ............................... 365/203, 189.01, 365/233

[56] References Cited

U.S. PATENT DOCUMENTS

| | | | |
|---|---|---|---|
| 4,658,381 | 4/1987 | Reed et al. | 365/203 |
| 5,043,945 | 8/1991 | Bader | 365/190 |
| 5,268,863 | 12/1993 | Bader et al. | 365/189 |
| 5,416,744 | 5/1995 | Flannagan et al. | 365/203 |
| 5,502,648 | 3/1996 | Koshikawa | 365/203 |
| 5,546,355 | 8/1996 | Raatz et al. | 365/233 |
| 5,625,598 | 4/1997 | Oba | 365/203 |
| 5,698,995 | 12/1997 | Usami | 365/203 |
| 5,724,286 | 3/1998 | Gillingham | 365/203 |
| 5,737,270 | 4/1998 | Oppold et al. | 365/203 |

*Primary Examiner*—Son T. Dinh
*Attorney, Agent, or Firm*—Craig J. Yudell

[57] ABSTRACT

A method and circuit for optimally controlling memory array bit line precharge timing to increase memory frequency of operation by generating a precharge output (110) for memory array bit lines in response to the earliest asserted control input among precharge control inputs. A write precharge signal (218) early enables a write precharge operation by enabling the precharge signal (110) a delayed period after an enabling falling dock edge of clock (104), as indicated by a write precharge enable signal (210), and during a write cycle, as indicated by a write precharge trigger (212). Thereafter, a default precharge trigger (216) is enabled to ensure that write precharging operation continues for an extended and optimal duration. A read precharge trigger (214) enables precharging after a read operation by enabling the precharge signal (110) in close proximity to the disabling of read sense amplifiers within the memory array to enhance post-read precharging. Thereafter, the default precharge trigger (216), is enabled to ensure that the read precharging operation continues for an extended and optimal duration.

14 Claims, 4 Drawing Sheets

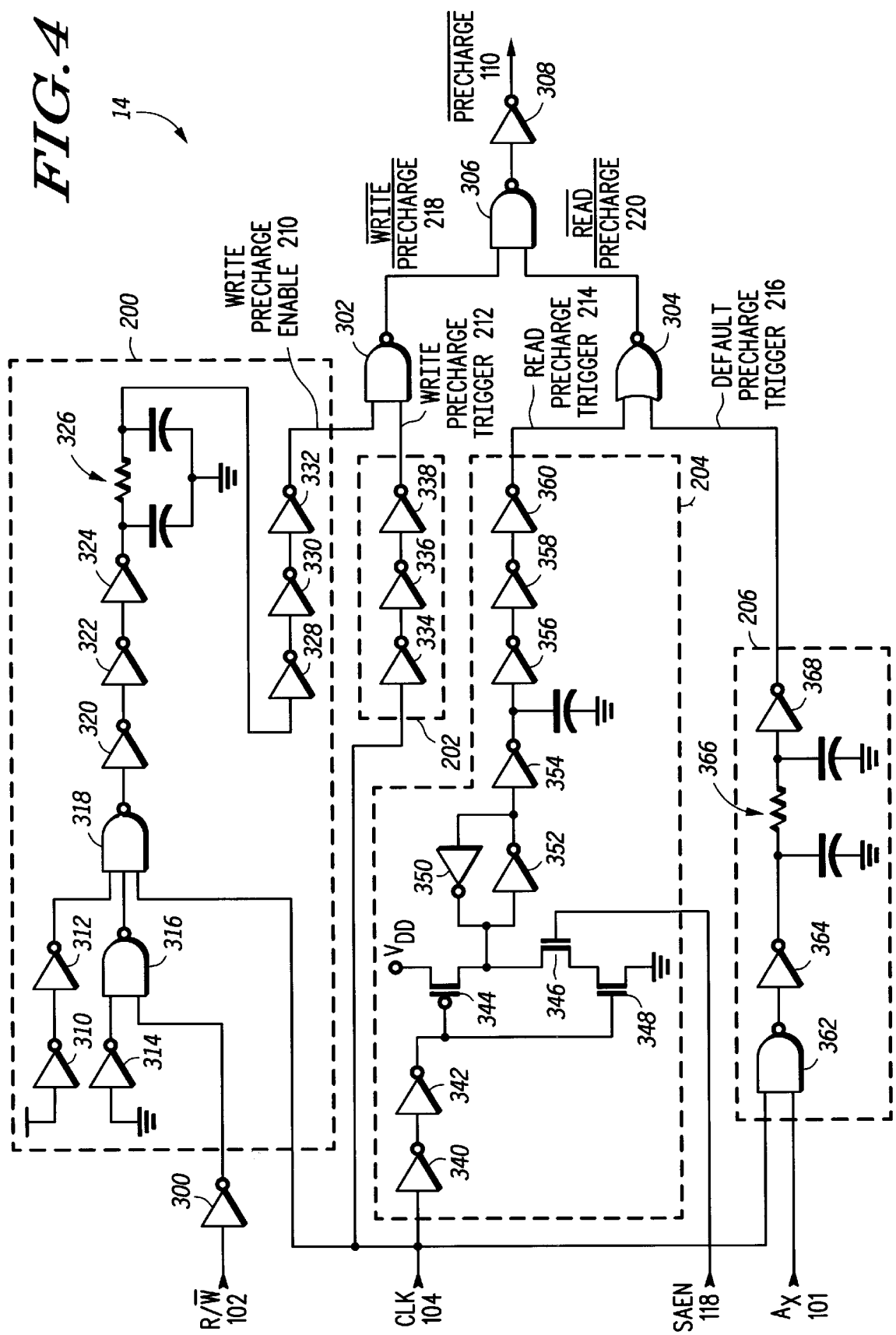

METHOD AND CIRCUIT FOR CONTROLLING A PRECHARGE CYCLE OF A MEMORY DEVICE

FIELD OF THE INVENTION

The present invention relates in general to a memory device and in particular to a memory array precharge control circuit and method of operation.

BACKGROUND OF THE INVENTION

In the integrated circuit (IC) industry, memory arrays are fabricated to contain a plurality of bit cells arranged in a two-dimensional layout (e.g., rows and columns). The rows and/or columns of these bit cells within the memory array are selectively written with binary data provided by data input. Once written to contain valid data, the bit cells may then be selectively subject to a read operation whereby selected written data may be read from a row and/or column of the memory array to a data output. During reading and writing operations, a selected memory row of bitcells or memory column of bitcells are selected by selectively enabling word line control signals. Bitlines allow for data access to and from bit cells which are provided with activated word lines.

In modern memory designs, these bit lines which are used to transfer data to and from the bit cells are precharged to predetermined voltages between read and write operations to ensure faster memory accesses (i.e., faster read and write operations). In a static random access memory (SRAM) array, SRAM cells output a differential signal when being read and receive a differential signal when being written. When being read, a specific row or column of SRAM cells are selected by word line activation, and these selected SRAM cells begin to drive the previously-precharged bit lines in opposite voltage directions to provide a differential data output over a short period of time. The output differential signal is sensed by sensitive sense amplifiers which can detect and latch binary signals from a differential output that differs in voltage on the order of several hundred millivolts (mV). Therefore, by the time a differential pair of bit lines charges a few hundred mV from the precharge voltage, the contents of the SRAM cells are sensed and latched by the sense amplifiers, whereby no more change in the bit lines is needed.

Therefore, due to the nature of the sensitive read sensing operation, precharge read operations need only precharge the bit lines on the order of several hundred millivolts (mV) in order to return the read bit lines back to a precharged state. Since the precharge circuitry need only charge the bit line a few hundred millivolts after a read operation, read precharge operations occur very quickly and rarely impact the theoretical maximum operation speed of the memory integrated circuit.

This fast read precharge is in sharp contrast to the write precharge operation. In a write operation to an SRAM, the differential input to the SRAM cell is forced to the power voltage rails, whereby one of the differential bit line inputs is driven to VDD (e.g., 3.3 Volts) and the other differential bitline is driven to ground (GND) in order to write the binary value into the SRAM cell. Therefore, a precharge operation following an SRAM write operation must charge the bitlines a full swing of VDD-GND (e.g., 3.3 volts) and not merely the several hundred millivolts (mV) required by the read precharge. Therefore, the write precharge operation takes much more time than the read precharge operation in an SRAM device. Due to this longer precharge time during write operations, the write precharge operation has been found to significantly limit the maximum frequency of operation in some memory ICs, where the read operation does not constrain the memory frequency of operation.

Prior art precharge controllers within integrated circuit (IC) memory devices have not yet adequately improved on the critical write precharge operation whereby frequency of operation can be significantly improved. A first prior art embodiment derives quadrature signals from a single dock source. The quadrature clock defines four distinct clock phases wherein each of the four distinct dock phases are bounded by definitive clock edges. These dock edges can be utilized to delineate a precharge period wherein this precharge period is equal for both the write operation and a read operation so that neither the read nor write operations are optimized. In addition, some modern memory design systems do not have a quadrature clock architecture wherein multiple dock edges and phases can be used to initiate control operations such as the start and stop of a precharge period. However, more flexible read/write customized control is needed.

A second prior art embodiment has used an early read precharge operation only for the non-critical read operation wherein the early read precharge is enabled in response to the end of sensing in the read sense amplifier. This read control circuitry enables read precharging after sense operations (whereby data reads are not adversely affected) and before a precharge-activation clock edge to create a longer precharge period directly after read operations. While this prior art improves performance in terms of post-read precharge operations, the write operation is the most time critical precharge operation in the memory array. The frequency-limiting write precharge operation is not improved by this sense-amplifier-triggered, post-read precharge.

Therefore, a need exists for a precharge control circuit which decouples write precharge timing from read precharge timing whereby both write and read precharging may be independently optimized so that the frequency of operation of a memory device can be advantageously increased.

BRIEF DESCRIPTION OF THE DRAWINGS

FIG. 4 shows a schematic of the circuitry used to form the circuit illustrated in FIG. 2 in accordance with the present invention.

DETAILED DESCRIPTION OF A PREFERRED EMBODIMENT

Figure 1:
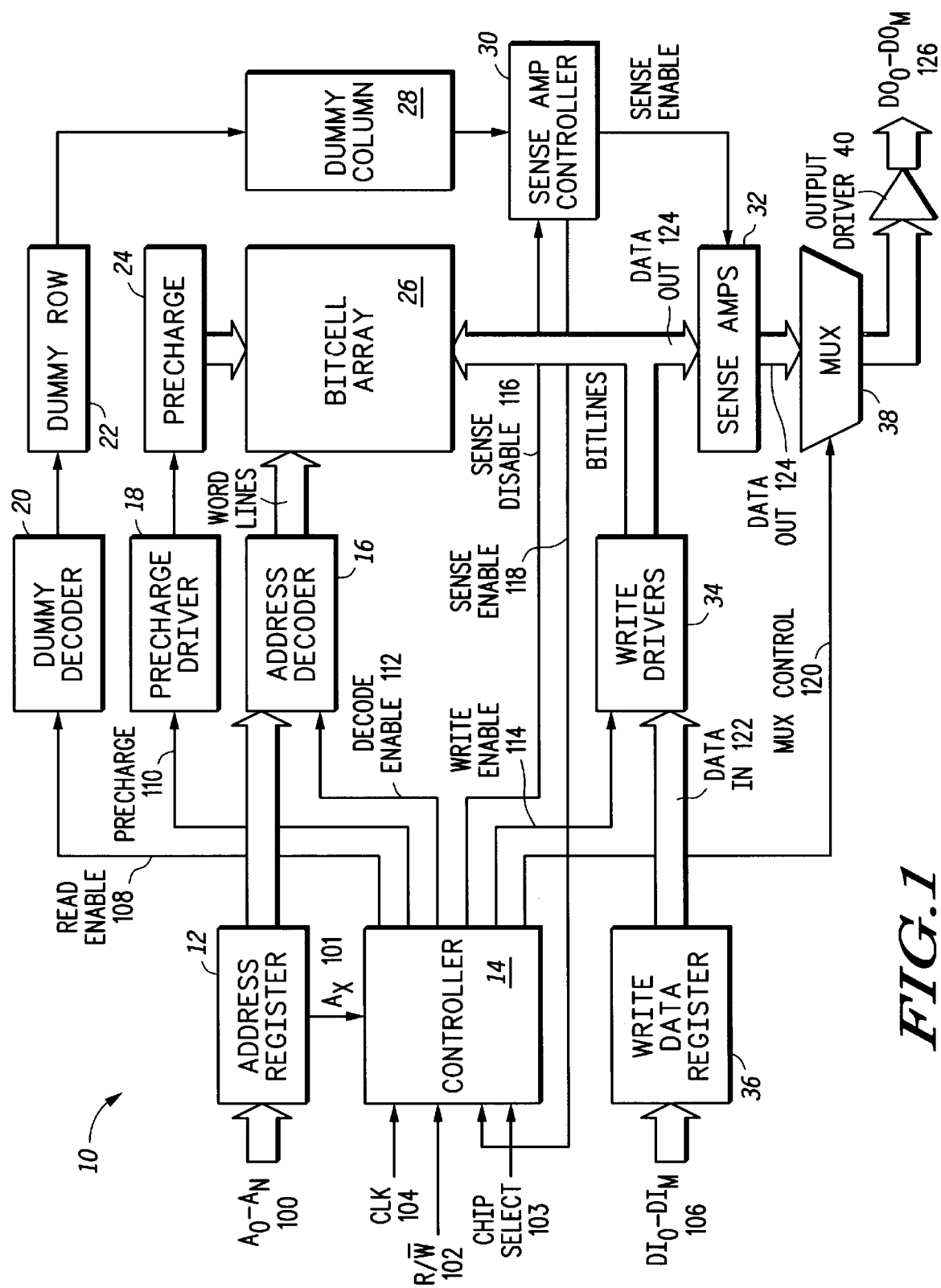
FIG. 1 illustrates, in a block diagram, an integrated circuit memory architecture in accordance with the present invention.

Generally, the present invention is a method and circuit for controlling memory array bit line precharge timing so that both write precharge operations and read precharge operations are independently optimized whereby memory frequency of operation is increased. As seen in the FIG. 2, a precharge output signal 110, which is used to precharge a plurality of memory array bit lines, is enabled in response to the earliest asserted control input among three primary precharge control inputs. A first precharge control input is a write_B precharge _B signal (write precharge) 218 which is used to early enable a write precharge operation by enabling the precharge _B signal (precharge) 110 in very close proximity to an enabling falling clock edge of clock 104. A write precharge trigger 212 activates the write precharge signal 218 during a write cycle as indicated by a write precharge enable signal. After the write precharge signal 218 begins a write precharge operation by enabling precharge signal 110, a second precharge control input, which is the default precharge trigger 216, is enabled to ensure that the write precharging operation continues for an extended and optimal duration. A third input referred to as a read precharge trigger 214 is used, also in conjunction with the second trigger 216, to enable precharging in close proximity to the disabling of read sense amplifiers within the memory array to enhance post-read precharging. Thus, the read precharge trigger 214 may enable the precharge signal 110 even before an assertion of the default precharge trigger 216 whereby more read precharging is possible. By segmenting the precharge operation into separate read and write precharge control via the use of three control signals 218, 216, and 214, the frequency of operation of a memory device may be increased significantly (increases of up to 16% have been found). This increase in speed of operation is due to the fact that the early write precharge enable reduces the critical and lengthy write precharge operation whereby the speed of operation can be improved. The invention can be further understood with reference to FIGS. 1–4.

FIG. 1 illustrates a memory architecture 10, in accordance with one example of a preferred embodiment of the present invention. Memory architecture 10 receives address bits ($A_O$–$A_N$) 100, a read/write control signal 102, a chip select signal 103, a dock signal 104, and data input bits 106 on input lines ($DI_O$–$DI_M$). FIG. 1 illustrates that N+1 address bits 100 are provided, wherein N is a finite positive integer equal to 5 or greater, for example. FIG. 1 illustrates that M+1 data input bits are provided, wherein M is a finite positive integer greater than zero. The memory architecture 10 of FIG. 1 provides data output bits($DO_O$–$DO_M$) 126. The data input bits 106 are used to provide write data to the memory architecture 10 during a write cycle, and the data output bits 126 are used to provide read data, which is output from the memory architecture 10 during a read cycle.

FIG. 1 illustrates that read or write addresses are latched by an address register 12. The latched address register signals are then provided to an address decoder 16. A control circuit 14 receives the dock signal 104, the read/write signal 102, a chip select signal 103, at least one address signal Ax 101, and a sense enable signal 118. The control circuit 14 controls all of the read and write timing within the memory architecture 10 and controls the read and write precharge operations taught herein. The data input bits 106 are coupled to a data write register 36 wherein the register 36 latches the incoming data values for a write operation. Data from the register 36 is provided through write drivers 34 to provide write data 122 to a memory (bit cell) array 26.

During a write cycle, the data 122 is provided to the bit cell array 26 and stored within the bit cell array. The data 106 is written to an address identified by address data 100, wherein the address data is decoded by address decoder 16 to provide one activated word line output in the memory array 26 selected for writing. Once selected for writing, the bit cell row is provided with the data 122 to be stored. The controller 14 controls the write operation through use of a write enable signal 114 and a decode enable signal 112.

During a read cycle or read operation, the bit cell array 26 provides data to the data output 124 for proper sensing. A read operation is also controlled by the controller 14 by providing a read enable signal 108. The read enable signal traverses through a dummy decoder 20, a dummy row 22, a dummy column 28, and a sense amplifier controller 30 before asserting a sense enable signal to the sense amplifiers 32. The dummy structures 20, 22, 28, and 30 represent a longest transmission delay through the memory architecture 10 and are provided to ensure that address data is properly provided through register 12 and decoder 16, and has fully settled throughout the entire selected bit cell row within bitcell array 26 before sensing starts. In other words, the dummy structures 20, 22, 28, and 30 ensure that sense operations are not performed prematurely and instead sense operations are performed once proper data is provided by the data output 124.

Sense amplifiers 32 are provided with output data from the memory array 26 during read operations and produce data output 124. If multiple bit cell arrays are located on a single integrated circuit, then a multiplexer 38 is used to select which bit cell array is to output data from the memory architecture 10. Once proper output is selected via the multiplexer 38, the data output is provided to output drivers 40 wherein the data output 126 is properly provided external to the integrated circuit or on an internal integrated circuit data bus. Notice that the data input lines (DATA IN) 122 and the data output lines (DATA OUT) 124 create a bi-directional bus wherein either the write drivers 34 are enabled while the sense amplifiers 32 are disabled or vice versa. In other words, a read and a write operation, when using the architecture of FIG. 1, cannot be supported simultaneously due to the single bi-directional interface to the bit cell array 26.

During both read and write operations to the bit cell array, the precharge signal 110 output from the controller 14 is disabled. In-between read and write operations, the precharge signal 110 is asserted whereby the precharge driver 18 and the precharge circuit 24 restores and maintains the bit lines of the bit cell array 26 to a predetermined precharge voltage to ensure adequate speed of operation. Note also that the control circuitry 14 controls the amount of time the sense amplifiers perform a sense operation. The sense amplifier control circuit 30 sends a sense enable signal 118 to the controller 14. In response to this sense enable assertion, the controller 14 provides a sense disable signal 116 to the sense amplifier controller 30 whereby the sense amplifiers are turned off to complete the read operation. Once write drivers 34 disable during a write operation via write enable 114 or sense amplifiers 32 are disabled by the sense disable 116 during a read operation, the precharge driver circuit 18 and the precharge circuit 24 are enabled to begin precharging of the bit lines within the bit cell array 26 to the precharge voltage.

Subsequent figures will focus on the operation of the precharge control circuitry of control circuit 14. The control circuit 14 of FIG. 1 contains an improved precharge control circuit 15 (shown in FIG. 2), which optimizes the operation of the precharge signal 110 in FIG. 1. Specifically, the control circuitry 14 outputs a precharge signal 110 as a function of the clock 104, the read/write signal 102, address data 101 and the sense enable 118. By outputting a precharge signal which is a function of these signals, both the read and write precharge operations can be customized to their own individual timing, whereby both the read and write precharge operations are optimally timed independent of one another. Specifically, the control circuit 14 asserts the precharge signal and de-asserts the precharge signal 110 at different times depending upon whether a read or a write operation is performed.

Figure 2:
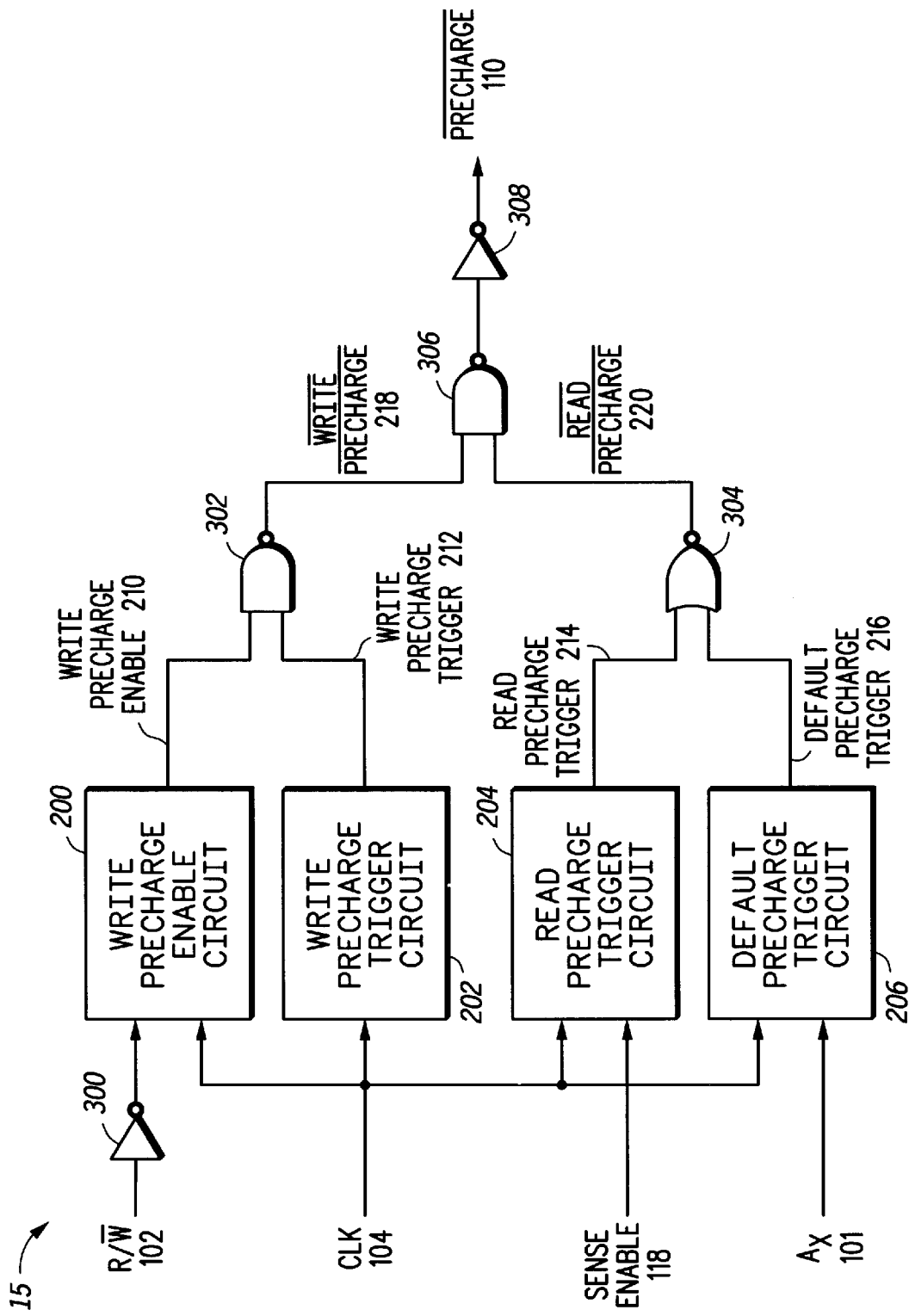
FIG. 2 illustrates, in a block diagram, a precharge control circuit which provides separate timing for write precharging and read precharging in accordance with the present invention.

FIG. 2, illustrates a precharge control circuit 15 of the control circuit 14 of FIG. 1, in accordance with one example of a preferred embodiment of the present invention. Precharge control circuit 15 is responsible for providing the precharge output precharge signal 110, as illustrated in FIG. 2, which is one of the six outputs generated by the circuitry 14 of FIG. 1. The precharge control circuit 15 of the control circuit 14 has four inputs including a read/write (R/_W) signal 102, a clock signal 104, a sense enable signal 118, and a subset of one or more address bits of address data (Ax) 101. FIG. 2, shows a single output which is an active low precharge enable precharge signal 110. Any time the precharge signal 110 is active low, bit lines within the bit cell array 26 of FIG. 1 are being precharged to a predetermined precharge voltage. Any time the active low precharge signal 110 is at a logic high value, precharge operations within the bit cell array 26 are suspended whereby read and write operations can occur on the bit lines within the bit cell array 26 of FIG. 1.

FIG. 2 specifically illustrates four circuits 200–206 which control the assertion of the precharge signal 110. The circuits 204 and 206 will operate in conjunction to provide an optimized read precharge active signal at the output 110. The circuits 200, 202, and 206 will operate in conjunction to provide an optimally activated precharge signal 110 following write operations. Specifically, circuit 204 will enable early read precharging while circuit 206 will provide default read precharging. In FIG. 2, the circuits 200 and 202 will provide early write precharge operations while the circuit 206 will provide default write precharging. Therefore, the default precharge trigger circuit 206 ensures a minimal amount of precharge time will occur for both the read and write operations whereby the circuits 200–204 will enable for different extensions of the precharge operation based upon whether a read or write operation has just been performed to the memory array 26.

The write precharge enable circuit 200 accepts as input an inverted read/write signal 102, which is inverted by an inverter 300, and the clock input 104. The write precharge enable circuit uses the read/write signal 102 and the clock 104 to output a write precharge enable signal 210. The write precharge trigger circuit 202 accepts dock signal 104 as an input. The write precharge trigger circuit 202 outputs a write precharge trigger signal 212 in response to an edge of the dock 104. Read precharge trigger circuit 204 accepts a sense enable output 118 provided from the sense enable control circuit 30 of FIG. 1 and the clock signal 104 as inputs. Read precharge trigger circuit 204 outputs a read precharge trigger signal 214 in response to various logic signals provided via the clock 104 and the sense enable 118. The default precharge trigger circuit accepts as input the dock 104 and a subset of address signals which includes one or more address bits of address data (Ax) 101. The default precharge trigger circuit 206 outputs a default precharge trigger signal 216.

The write precharge enable signal 210, the write precharge trigger signal 212, the read precharge trigger signal 214, and the default precharge trigger signal 216 are all active high signals. These active high signals are passed through a logic circuit, including through a NAND gate 302 (logic gate) and a NOR gate 304 (logic gate) in pairs, respectively, as illustrated in the FIG. 2, to produce a logical combination of the input signals. The NAND gate 302 outputs an active low write precharge signal 218 wherein the write precharge signal 218 is active low when both the write precharge enable signal 210 and the write precharge trigger signal 212 are asserted active high via the circuits 200 and 202. The NOR gate 304 outputs an active low read_B precharge_B signal (read precharge) 220 when one of either the read precharge trigger 214 or the default precharge trigger 216 is active high. Therefore, the only time the read precharge signal 220 is inactive high is when both the signals 214 and 216 of FIG. 2 are inactive low. A two input NAND gate 306 or its equivalent is used in FIG. 2 to output an active logic high signal when either one of the active signals 218 or 220 are active low. The inverter 308 is used to invert the output of the NAND gate 306 so that the precharge signal 110 is also an active low signal. Thus, the precharge signal 110 is active low when either one of the write precharge signal 218 or the read precharge signal 220 is active low.

Figure 3:
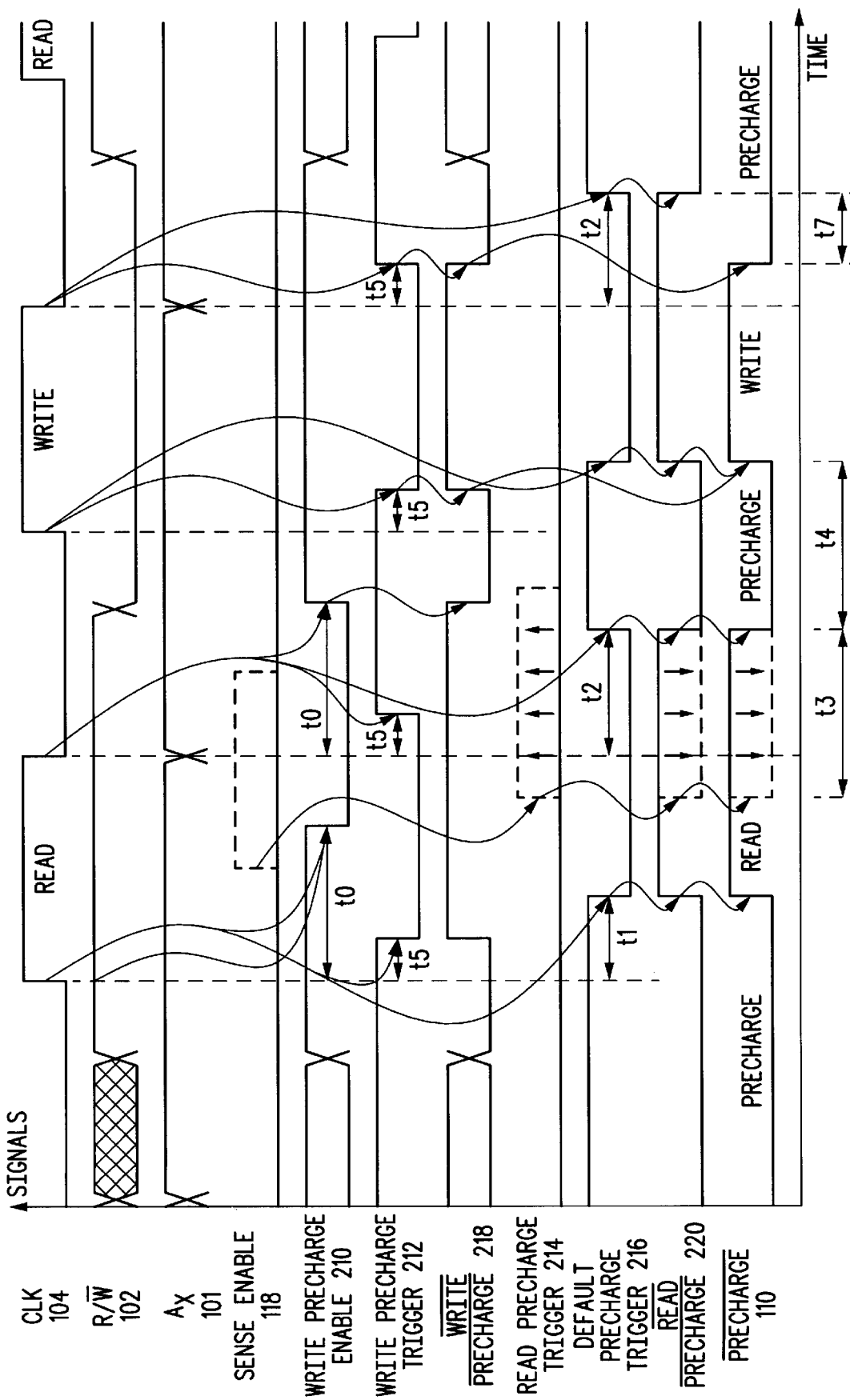
FIG. 3 illustrates, in a timing diagram, the operation of the circuitry of FIGS. 2 and 4 in accordance with the present invention.

FIG. 3 illustrates a timing diagram that contains all of the signals illustrated previously in FIG. 2. Therefore, FIG. 3 illustrates the clock 104, the read/write signal 102, the subset of address bits 101, sense enable 118, write precharge enable 210, write precharge trigger 212, active low write precharge signal 218, read precharge trigger 214, default precharge trigger 216, active low read precharge signal 220, and the active low precharge signal 110. FIG. 3 specifically illustrates a read operation followed by a write operation wherein the various control signals of FIG. 2 are illustrated with respect to one another. FIG. 3 is further explained in detail subsequently after the discussion of FIG. 4.

FIG. 4 shows a more detailed schematic of the circuit of FIG. 2, in accordance with one example of a preferred embodiment of the present invention. FIG. 4 specifically illustrates the same four input signals; read/write signal 102, clock 104, sense enable 118, and address data 101 that were previously illustrated in FIG. 2. FIG. 4 also illustrates the four intermediate active high signals 210–216 which are output of the circuits 200–206 of FIG. 2. FIG. 4 also illustrates the intermediate active low signals 218 and 220 from FIG. 2. In addition, the active low output signal of precharge signal 110 is also illustrated in FIG. 4. Because the same input, output, and intermediate signals of FIG. 2 are illustrated in FIG. 4, FIG. 4 also illustrates the inverter 300, the NAND gate 302, the NOR gate 304, the NAND gate 306, and the inverter 308 which was previously illustrated in FIG. 2. The primary purpose of FIG. 4 is to illustrate in specific detail the contents of the various circuits 200–206 which were previously illustrated with respect to FIG. 2.

FIG. 4 illustrates the write precharge enable circuit 200 of FIG. 2 in greater detail. The circuit 200 of FIG. 4 illustrates the inverted input from the read/write signal 102 through the inverter 300. FIG. 4 also illustrates the clock 104 input to the circuit 200. FIG. 4 contains inverters 310, 312, and 314 which are used for integrated circuit test purposes and are not specifically related to the read and write precharge operations during normal modes of operation. FIG. 4 illustrates NAND gate 316 which accepts the test signals and the inverted read/write signal 102. The output of NAND gate 316 is provided to another NAND gate 318, where the NAND gate 318 also accepts as input the test signals from inverters 310, 312 and 314 along with the dock signal 104. The output of NAND gate 318 is connected in series through three inverters; 320, 322, and 324. The output of inverter 324 is used to drive various control logic either from the control circuit 14 or from a portion of precharge control circuit 15 of FIG. 2. Therefore, FIG. 4 illustrates an RC network 326 coupled to an output of inverter 324 wherein the network 326 is not actual physical devices formed on the integrated circuit but is an RC network representing the output load of the inverter 324. The output of inverter 324, in addition to driving other control circuitry, drives an inverter 328 in circuit 200. The output of inverter 328 is fed through an inverter 330 and an inverter 332 whereby the write precharge enable signal 210, which is active high, is produced.

The write precharge trigger circuit 202 is illustrated in FIG. 4. The write precharge trigger circuit 202 of FIG. 4 contains three serially coupled inverters 334, 336, and 338, which have an input coupled to the clock signal 104 in FIG. 4. Therefore, the output write precharge trigger 212, which is active high, is simply an inverted and time delayed replication of the clock signal 104. When both the write precharge enable signal 210 and the write precharge trigger 212 are active high, the output write precharge signal 218 is activated at a low logic state. Therefore, write precharge operations are enabled by the active high assertion of both of the signals 210 and 212 of FIG. 4.

FIG. 4 illustrates the read precharge trigger circuit 204 in greater detail. FIG. 4 illustrates that the circuit 204 accepts as input the sense amplifier enable signal (SAEN) 118 and the dock signal 114. The clock signal is buffered in a non-inverting manner through two inverters 340 and 342. Therefore, a time delayed dock signal 104 is provided to the gates of transistors 344 and 348. When the dock signal 104 is low, transistor 344 is turned on, wherein the input to the latch formed by inverters 352 and 350 is a logic high (one) from VDD. A logic zero (low) is consequently provided out of the inverter 352. When both the SAEN (sense enable) 118 and the clock signal 104 are high, transistors 348, 346 are turned on, providing a ground potential to an input of the latch (keeper) circuit containing inverters 350 and 352 wherein a logic zero (low) is provided as output on the inverter 352. The keeper circuit containing cross coupled inverters 350 and 352 has an output coupled to an inverter 354. The output of inverter 354 is coupled through three inverters 356, 358, and 360 to provide an active high read precharge trigger signal 214. Notice that the read precharge trigger signal 214 is asserted at an active high logic state when both the sense enable 118 and the clock 104 are in logic one activated states.

FIG. 4 illustrates the default precharge trigger circuit 206 of FIG. 2 in greater detail. Specifically, circuit 206 of FIG. 4 accepts as input the clock signal 104 and at least one address bit of address data (Ax) 101. The signal Ax, address data (Ax) 101, is used to enable one of a plurality of controllers 14 in FIG. 1 so that multiple blocks of memory bitcell array 26 can be positioned on a same integrated circuit. Therefore, the address data (Ax) 101 provides additional higher level block decoding for the memory integrated circuit over and above the row and column decoding performed within the bit cell array 26. In other embodiments, the address data (Ax) 101 can be any number of address bits equal to zero or greater than zero and address data (Ax) 101 can also be any signal which is decoded from one or more address signals. The address data 101 and the clock 104 are provided to inputs of a NAND gate 362. An output of the NAND gate 362 is provided to an inverter 364. The output of the inverter 364 is used to drive one or more control signals either output from the controller 14 of FIG. 1 or output from a precharge control circuit 15 of the controller 14 illustrated in FIG. 2. Due to the fact that the inverter 364 drives additional logic, FIG. 4 illustrates an RC network 366 which represents the additional load on these control signals. Therefore, the RC elements in circuit 366 are not actual physical devices formed within the integrated circuit but are loading devices present within the circuit of FIG. 4 to allow for proper timing simulation in a software simulation program, for example. The output of the inverter 364 is coupled through another inverter 368 in order to provide a default precharge trigger signal 216, which is active high.

The operation of FIG. 4 is now discussed with reference to the timing diagram of FIG. 3. FIG. 3 shows a signal timing diagram of the input and output signals represented in FIG. 2, in accordance with one example of a preferred embodiment of the present invention. As can be seen in FIG. 3, at the beginning of period t0, a rising edge of clock 104 occurs while read/write signal 102 and address data 101 are high and sense enable 118 is low. The rising clock 104 causes a falling edge at the end of period t0 on write precharge enable 210. Similarly, the rising clock 104 causes, after a delay, a falling edge on write precharge trigger 212. Similarly, with a valid address on address data 101, the rising edge of clock 104 causes a falling edge on default precharge trigger 216 a period t1 later. Through NOR gate 304, default precharge trigger 216 causes a rising edge on read precharge 220, and causes a rising edge on precharge signal 110 through NAND 306 and buffer 308. After period t1, the read operation begins in the memory architecture 10. Sometime later, when sense amp controller 30 indicates the end of the read operation by a rising edge on sense enable 118, transistor 346 is turned on and the latched value in inverters 350, 352 is switched, whereby read precharge trigger 214 transitions to a logic high.

Multiple arrows are shown with the dashed lines on signals sense enable 118, read precharge trigger 214, read precharge 220, and precharge signal 110 to indicate that those signals can transition between states at any time along those dash lines. Such a transition would indicate an early end of the read operation, allowing an early read precharge to occur in the memory array. The rising read precharge trigger 214 results from the rising sense enable 118 and in turn causes a falling read precharge 220 and a falling precharge signal 110. At the falling edge of precharge signal 110 caused by the early precharge trigger of read precharge trigger 214, precharge driver 18 and precharge circuit 24 shown in FIG. 1 causes a precharge of bit cell array 26 in advance of the default precharge trigger 216. As can be seen in FIG. 3, the period t3 (or up to period t3) represents the additional precharge time provided by the present invention when it is sensed that a read operation has completed early. The time period t4 represents the minimum amount of precharge that is provided by the system regardless of whether the read operation is completed early.

The falling edge of clock 104 causes write precharge enable 210 to rise a period t0 after the falling edge of clock 104 and also causes write precharge trigger 212 to rise a period t5 (selected period) after the falling edge of clock 104. The period t0 corresponds to the propagation delay for the rising edge of clock 104 to propagate through write precharge enable circuit 200, and the period t5 corresponds to the propagation delay of circuit 202. With write precharge trigger 212 high, the rising edge of write precharge enable 210 causes a falling edge on write precharge signal 218.

The falling edge on clock 104 also causes default precharge trigger 216 to rise a period t2 (selected period) after the falling edge. The period t2 corresponds to the propagation delay through default precharge trigger circuit 206. As can be seen, the default precharge trigger circuit 206 is designed with a NAND gate 362 having a faster response to the falling edge of clock 104 than it does to the rising edge of clock 104, thereby a quicker response (period t1) is produced on default precharge trigger 216 at the rising edge of clock 104 then at the trailing edge of clock 104 (period t2). The default precharge trigger 216 rising edge causes a falling transition on read precharge 220, in the event that read precharge 220 has not previously been transitioned by read precharge trigger 214, thereafter causing precharge signal 110 to transition low to start the precharge period.

As seen in FIG. 3, the second rising edge of clock 104 represents the beginning of a write cycle for this example. The write cycle is indicated by the read/write signal 102, which has transitioned low. A period t5 after the rising edge of clock 104, write precharge trigger signal 212 transitions low, causing write precharge 218 to transition high. As will be appreciated, the period t5 represents the propagation delay introduced by write precharge trigger circuit 202 to the clock signal 104. Because the previous falling edge of clock 104 had set write precharge enable 210 high, the falling edge of write precharge trigger 212 causes a rising edge of write precharge 218. A high logic level write precharge 218 and the rising edge of read precharge 220 causes a precharge signal 110 rising edge, whereby the precharge cycle is terminated and a write operation can begin (note that the default precharge trigger 216 will also terminate the precharge cycle if prior to the write precharge trigger 212).

The second falling edge of clock 104 during the write cycle causes a rising edge on write precharge trigger 212 a period t5 after the falling edge, and in turn causes a falling edge on write precharge 218. The falling edge on write precharge 218 causes the falling edge on precharge signal 110 at the beginning of period t7, whereby the precharge cycle of the memory architecture 10 begins early after the write operation. As can be seen from FIG. 3, the period t7 indicates additional precharge time after a write operation provided by the present invention. As shown in FIG. 3, a period t2 after the falling edge of clock 104, default precharge trigger 216 transitions to a logic high level. The rising edge of default precharge trigger 216 causes read precharge 220 to transition low. In prior systems, the falling edge of read precharge 220 would trigger the falling edge of precharge signal 110 to begin the precharge cycle after the write operation. However, the write precharge circuitry of the present invention has already started the precharge cycle earlier than this default transition. Thus, the period t7 represents the increment of additional time for the precharge cycle provided after a write operation by the preferred embodiment of the present invention.

As will now be appreciated, the present invention allows both read and write precharging to be independently optimized and allowing the frequency of operation of the memory device to be increased significantly because the early write precharge enable allows the frequency-limiting write precharge operation to have an increased precharge time. While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A precharge control circuit for a memory array, comprising:
    a write precharge enable circuit that receives a write control signal and a clock signal and generates a write precharge enable signal, wherein the write control signal indicates that the memory array is performing a write cycle;
    a write precharge trigger circuit that receives the clock signal and generates a write precharge trigger signal a first selected period of time after receiving the clock signal;
    a default precharge trigger circuit that receives the clock signal and generates a default precharge trigger signal a second selected period after receiving the clock signal, wherein the second selected period is greater than the first selected period; and
    a logic circuit that receives the write precharge enable signal, the write precharge trigger signal and the default precharge trigger signal and generates a precharge signal that controls a precharge cycle of the memory array, wherein the precharge signal is generated in response to a logical combination of the write precharge enable signal, the write precharge trigger signal and the default precharge trigger signal.

2. A precharge control circuit of claim 1, wherein the first selected period provides a sufficient period of time after the write precharge trigger circuit receives the clock signal to allow the memory array to complete a write cycle before providing the precharge signal.

3. A precharge control circuit of claim 1, wherein the logic circuit generates the precharge signal in response to the default precharge trigger signal after a read cycle of the memory array.

4. A precharge control circuit of claim 1, further comprising a read precharge trigger circuit that receives the clock signal and a sense enable signal and generates a read precharge trigger signal that is received by the logic circuit, wherein the sense enable signal indicates when a read operation has completed and the read precharge trigger signal is generated a third selected period of time after receiving the sense enable signal, and wherein the logic circuit receives the read precharge trigger signal and generates the precharge signal in response to a logical combination of the write precharge enable signal, the write precharge trigger signal, the default precharge trigger signal, and the read precharge trigger signal.

5. A precharge control circuit of claim 1, wherein the logic circuit includes a logic gate that receives the write precharge enable signal and the write precharge trigger signal to generate a write precharge signal.

6. A precharge control circuit of claim 5, wherein the write precharge signal asserts the precharge signal and the default precharge trigger negates the precharge signal.

7. A precharge control circuit of claim 5, wherein the logic gate is a first NAND gate and an output of the first NAND gate is connected to a second NAND gate and the default precharge trigger signal is coupled to the second NAND gate, and wherein the precharge signal is generated in response to an output of the second NAND gate.

8. A precharge control circuit of claim 1, wherein the default precharge trigger circuit receives an address signal indicating that the memory array is enabled, and wherein the default precharge trigger circuit sets the precharge signal in response to the address signal.

9. A precharge control circuit of claim 1, wherein the write precharge trigger circuit includes a plurality of logic gates receiving the clock signal and outputting the write precharge trigger signal after the first selected period.

10. A method of controlling a precharge cycle of a memory array, the method comprising the steps of:
    generating a write precharge signal in response to a read/write signal indicating a write cycle and an end of a first selected period after a clock signal;
    generating a default precharge trigger signal in response to an end of a second selected period after the clock signal, wherein the first selected period is less than the second selected period; and
    generating a precharge signal for controlling the precharge cycle of the memory array in response to the write precharge signal and the default precharge trigger signal.

11. A method according to claim 10, wherein the write precharge signal is generated after a write operation of the memory array.

12. A method according to claim 10, further comprising the step of:

generating a read precharge trigger signal in response to a sense enable signal indicating one or more columns of the memory array are being sensed, wherein the read precharge trigger signal is generated a third selected period of time after receiving the sense enable signal, wherein the second selected period is greater than the third selected period.

13. A method according to claim 12, wherein the third selected period is greater than the first selected period.

14. A method of controlling a precharge cycle of a memory array, the method comprising the steps of:

initiating a precharge cycle a first selected period after a read cycle of the memory array;

initiating a precharge cycle a second selected period after a write cycle of the memory array, wherein the second selected period is less than the first selected period; and terminating a precharge cycle in response to a clock signal.

* * * * *